United States Patent
Tachibana

(10) Patent No.: US 9,936,616 B2
(45) Date of Patent: Apr. 3, 2018

(54) ELECTRIC POWER CONVERTOR

(71) Applicant: DENSO CORPORATION, Kariya, Aichi-pref. (JP)

(72) Inventor: Hideaki Tachibana, Nagoya (JP)

(73) Assignee: DENSO CORPORATION, Kariya (JP)

( * ) Notice: Subject to any disclaimer, the term of this patent is extended or adjusted under 35 U.S.C. 154(b) by 36 days.

(21) Appl. No.: 14/581,634

(22) Filed: Dec. 23, 2014

(65) Prior Publication Data
US 2015/0189790 A1    Jul. 2, 2015

(30) Foreign Application Priority Data

Dec. 26, 2013  (JP) ................................. 2013-269238
Jun. 2, 2014   (JP) ................................. 2014-114268

(51) Int. Cl.
*H05K 7/20* (2006.01)

(52) U.S. Cl.
CPC ..... *H05K 7/20927* (2013.01); *H05K 7/20254* (2013.01)

(58) Field of Classification Search
CPC ...................... H05K 7/20263; H05K 7/20927; H01L 25/00; H01L 2924/1305; H01L 2924/13055; H01L 2924/1306; H01L 2924/13091; H02M 7/04
See application file for complete search history.

(56) References Cited

U.S. PATENT DOCUMENTS

| | | | | |
|---|---|---|---|---|
| 6,972,957 B2* | 12/2005 | Beihoff | ................... | B60L 11/12 165/104.33 |
| 7,016,192 B2* | 3/2006 | Beihoff | ................... | B60L 11/12 257/714 |
| 7,710,723 B2* | 5/2010 | Korich | ............... | H05K 7/20927 165/104.33 |
| 7,830,689 B2* | 11/2010 | Nakamura | ............ | H02M 7/003 363/141 |
| 8,059,404 B2* | 11/2011 | Miller | ................... | H02M 7/003 165/104.33 |
| 8,929,097 B2* | 1/2015 | Nakasaka | ............. | H01L 23/473 361/688 |
| 9,137,932 B2* | 9/2015 | Tokuyama | .............. | H01L 23/36 |

(Continued)

FOREIGN PATENT DOCUMENTS

JP   2011-134813   7/2011
JP   2011-171449   9/2011

*Primary Examiner* — Robert J Hoffberg
*Assistant Examiner* — Matt Dhillon
(74) *Attorney, Agent, or Firm* — Nixon & Vanderhye P.C.

(57) ABSTRACT

An electric power converter includes a stacked semiconductor unit formed by stacking semiconductor modules and cooling tubes, and a case. The case has a rear wall portion, a front wall portion, and a pair of side wall portions. The rear wall portion has an opening hole formed in a shape that an outer profile of the cooler fits inside. The stacked semiconductor unit has a closing member joined to a rear-most cooling pipe that is disposed on a rear side to close the opening hole, a refrigerant introducing pipe extended rearward from the closing member, and a refrigerant discharging pipe extended rearward from the closing member. The refrigerant introducing pipe and the refrigerant discharging pipe, and the closing member are connected in close contact with each other, and the closing member and the case are in close contact by a seal section.

12 Claims, 11 Drawing Sheets

(56) References Cited

U.S. PATENT DOCUMENTS

| | | | | |
|---|---|---|---|---|
| 2010/0025126 A1* | 2/2010 | Nakatsu | .................. | B60L 11/00 |
| | | | | 180/65.1 |
| 2011/0194249 A1* | 8/2011 | Nakasaka | ............. | H01L 23/473 |
| | | | | 361/689 |
| 2012/0033475 A1* | 2/2012 | Tokuyama | ............ | H01L 23/473 |
| | | | | 363/131 |
| 2014/0160822 A1* | 6/2014 | Kuwano | ............... | H02M 7/003 |
| | | | | 363/141 |

* cited by examiner

ELECTRIC POWER CONVERTOR

CROSS-REFERENCE TO RELATED APPLICATION

This application is based on and claims the benefit of priority from earlier Japanese Patent Applications No. 2013-269238 filed Dec. 26, 2013, and No. 2014-114268 filed Jun. 2, 2014, the descriptions of which are incorporated herein by reference.

TECHNICAL FIELD

The present disclosure relates to an electric power converter that includes a stacked semiconductor unit formed by stacking semiconductor modules and cooling tubes for cooling the semiconductor modules.

BACKGROUND

An electric power converter is mounted in an electric vehicle or a hybrid vehicle, etc., for converting DC power from a battery into three-phase AC power in order to drive a three-phase AC rotating electric machine. Such an electric power converter is disclosed in Japanese Patent Application Laid-Open Publication No. 2011-171449 (JP-A-2011-171449), for example.

The electric power converter of JP-A-2011-171449 has semiconductor modules, a cooler for cooling the semiconductor modules, and a case for enclosing the semiconductor modules and the coolers. The cooler has a refrigerant passage for circulating a refrigerant therein, and is formed by connecting a plurality of cooling tubes that are stacked alternately with the semiconductor modules by connecting tubes. The cooler has a supply pipe for supplying the refrigerant to the refrigerant passage, and a discharge pipe for discharging the refrigerant in the refrigerant passage. The supply pipe and the discharge pipe are inserted and disposed respectively on a pair of sealing members that fill gaps between the case and the tubes.

The case has a case body with a bottom portion disposed below the semiconductor modules and the cooler and wall portions disposed standing perpendicularly from outer edges of the bottom portion, and a lid portion that covers an opening formed on an upper end of the case body. Cutouts for projecting the supply pipe and the discharge pipe of the cooler to the outside of the case are formed on one of the wall portions. The case body, the lid portion, and gaps between the supply pipe and the discharge pipe are sealed by sealing members by fitting the sealing members to which the supply pipe and the discharge pipe are inserted into the cutouts as well as fixing the lid to the case body.

However, the electric power converter disclosed in JP-A-2011-171449 has the following problems.

In the electric power converter disclosed in JP-A-2011-171449, the case body, the lid portion and the supply pipe or the discharge pipe are sealed by a single sealing member. Therefore, when misalignment between the case body and the lid portion, and misalignment between the case and the supply pipe or the discharge pipe occur one-sidedly, the gap increases partially. In such a case, the gap increases with respect to the size of the sealing member, and it becomes difficult to maintain the sealability by the sealing member.

Further, when load is applied to tips of the supply pipe and the discharge pipe in a direction intersecting with an axial direction of the pipe, the sealing member is easily deformed by being pressed by the supply pipe and the discharge pipe. Thus, it is not possible to suppress the deformation of the supply pipe and the discharge pipe by the sealing member, and stress is generated at roots of the supply pipe and the discharge pipe. Therefore, it is necessary to provide a clamp for regulating the displacement of the supply pipe and the discharge pipe, and thus the number of components of the electric power converter has been increased.

In addition, a miniaturization of the electric power converter is desired in recent years. As a means to reduce the size of the electric power converter, there is a miniaturization of the cooler. The miniaturization of the cooler is carried out by a miniaturization of an outer profile of the cooling tube, and a miniaturization of a diameter of the connecting pipe. At this time, it is necessary to reduce diameters of the supply pipe and the discharge pipe to fit the outer profile of the cooling tube. On the other hand, since a diameter of an external pipe connected to distal ends of the supply pipe and the discharge pipe is the same as a diameter of the conventionally used pipe, it is necessary to form small diameter portions and large diameter portions having diameters larger than the small diameter portions in the supply pipe and the discharge pipe. When disposing the small diameter portions and the large diameter portions in the supply pipe and the discharge pipe, since changing sections for changing the diameters between the two are required, it is necessary to increase the length of the supply pipe and the discharge pipe.

SUMMARY

An embodiment provides an electric power converter that can reduce a number of components, can be miniaturized, and can easily improve sealability.

In an electric power converter according to a first aspect, the electric power converter includes a semiconductor structure unit that has semiconductor modules that are parts of a power conversion circuit and a cooler for cooling the semiconductor modules, and a case that accommodates the semiconductor structure unit inside.

The case includes a rear wall portion having an opening hole, a front wall portion disposed opposing a front side of the rear wall portion, and a pair of side wall portions that connect both ends of the rear wall portion and the front wall portion with each other in a lateral direction.

The opening hole is formed in a shape that an outer profile of the cooler fits inside when viewed from a longitudinal direction in which the rear wall portion and the front wall portion are aligned along.

The semiconductor structure unit has a closing member joined to a rear-most cooling pipe that is disposed on a rear side in the longitudinal direction to close the opening hole, a refrigerant introducing pipe extended rearward from the closing member and introduces a coolant into the cooler, and a refrigerant discharging pipe extended rearward from the closing member and discharges the refrigerant from the inside of the cooler.

The closing member and the case are in close contact by a seal section formed between the closing member and the rear wall portion.

In the electric power converter, the refrigerant introducing pipe and the refrigerant discharging pipe are extended from the closing member, as well as connected in close contact with each other. Thus, by connecting the refrigerant introducing pipe and the refrigerant discharging pipe directly to the closing member, the sealability of the refrigerant introducing pipe, the refrigerant discharging pipe and the closing member is ensured while positioning between them can be performed easily. Thereby, dimensional accuracy between the refrigerant introducing pipe, the refrigerant discharging pipe and the closing member is improved, and a use of a component conventionally required for regulating positions of the refrigerant introduction pipe and the refrigerant discharging pipe becomes unnecessary. Accordingly, the number of parts in the electric power converter is reduced, and it is possible to simplify the structure of the electric power converter.

In addition, since the refrigerant introducing pipe and the refrigerant discharging pipe are made to extend from the closing member, a seal between outer surfaces of the refrigerant introducing pipe and the refrigerant discharging pipe, and the case becomes unnecessary. Although a seal between the case and the closing member is necessary, a seal section between them is formed by close contact between the two components. Therefore, it is possible to easily ensure the sealability of the case. By fixing the closing member with respect to the case, the positioning of both components can be easily performed, and thus it is possible to prevent the sealability from decreasing due to misalignment.

Further, the refrigerant introducing pipe and the refrigerant discharging pipe are connected to the cooler through the closing member. Therefore, the length of the refrigerant introducing pipe and the refrigerant discharging pipe can be shortened compared with a case where the refrigerant introducing pipe and the refrigerant discharging pipe are connected to the cooler directly. Accordingly, it is possible to alleviate the stress generated in roots of the refrigerant introducing pipe 51 and the refrigerant discharging pipe 52 when a load is applied to tip sides of the refrigerant introducing pipe 51 and the refrigerant discharging pipe 52.

Further, the refrigerant introducing pipe and the refrigerant discharging pipe are extended rearward from the closing member, and are not needed to be directly joined to the rear-most cooling pipe. Therefore, it is possible to design diameters of the refrigerant introducing pipe and the refrigerant discharging pipe regardless of the size of the cooler. Therefore, even when a small cooler is adopted, it is not necessary to reduce accordingly the diameters of joint portions of the refrigerant introducing pipe and the refrigerant discharging pipe to the rear-most cooling pipe. Thus, the electric power converter 1 can be miniaturized without making the shapes of the refrigerant introducing pipe 51 and the refrigerant discharging pipe 52 complicate.

As described above, according to the electric power converter of the present embodiment, miniaturization and a reduction of the components become possible, and the sealability can be easily improved.

In the electric power converter according to a second aspect, the cooler has a plurality of cooling tubes, and the semiconductor structure unit is a stacked semiconductor unit formed by stacking the semiconductor modules and the plurality of cooling tubes.

In the electric power converter according to a third aspect, the seal section is an opposing seal section formed to oppose the rear wall portion in the closing member in the longitudinal direction, and the closing member and the rear wall portion are brought into close contact by the opposing seal section.

In the electric power converter according to a fourth aspect, the closing member has a closing projection projecting into an inner side of the opening hole.

The seal section is an outer peripheral seal section formed by the closing projection and an inner surface of the opening hole in a direction perpendicular to the longitudinal direction of the closing projection, and the rear wall portion and the closing member are brought into close contact by the outer peripheral seal section.

In the electric power converter according to a fifth aspect, the closing member has a pair of penetrating holes, and the refrigerant introducing pipe and the refrigerant discharging pipe are fitted and fixed to the pair of penetrating holes.

In the electric power converter according to a sixth aspect, the case has an inner wall portion formed so as to be perpendicular with the rear wall portion, the front wall portion, and the pair of side wall portions.

The inner wall portion has an insertion opening in a position corresponding to a module disposition space of the semiconductor structure unit for inserting the semiconductor modules to the module disposition space.

In the electric power converter according to a seventh aspect, the insertion opening is formed with a width in the lateral direction shorter than a distance between the refrigerant introducing pipe and the refrigerant discharging pipe.

The insertion opening is formed with a length in the longitudinal direction shorter than a full length of the stacked semiconductor unit, and the insertion opening is formed in a shape that an outer profile of the semiconductor modules fits inside when viewed from a height direction.

In the electric power converter according to an eighth aspect, a reinforcing member for enhancing the strength of the closing member is attached to the closing member.

DETAILED DESCRIPTION OF THE PREFERRED EMBODIMENTS

In the present specification, a lateral direction is a direction perpendicular to a longitudinal direction, and refers to a direction in which a pair of side wall portions are opposed to each other.

First Embodiment

An embodiment according to an electric power converter will be described with reference to FIGS. 1 to 6.

Figure 1:
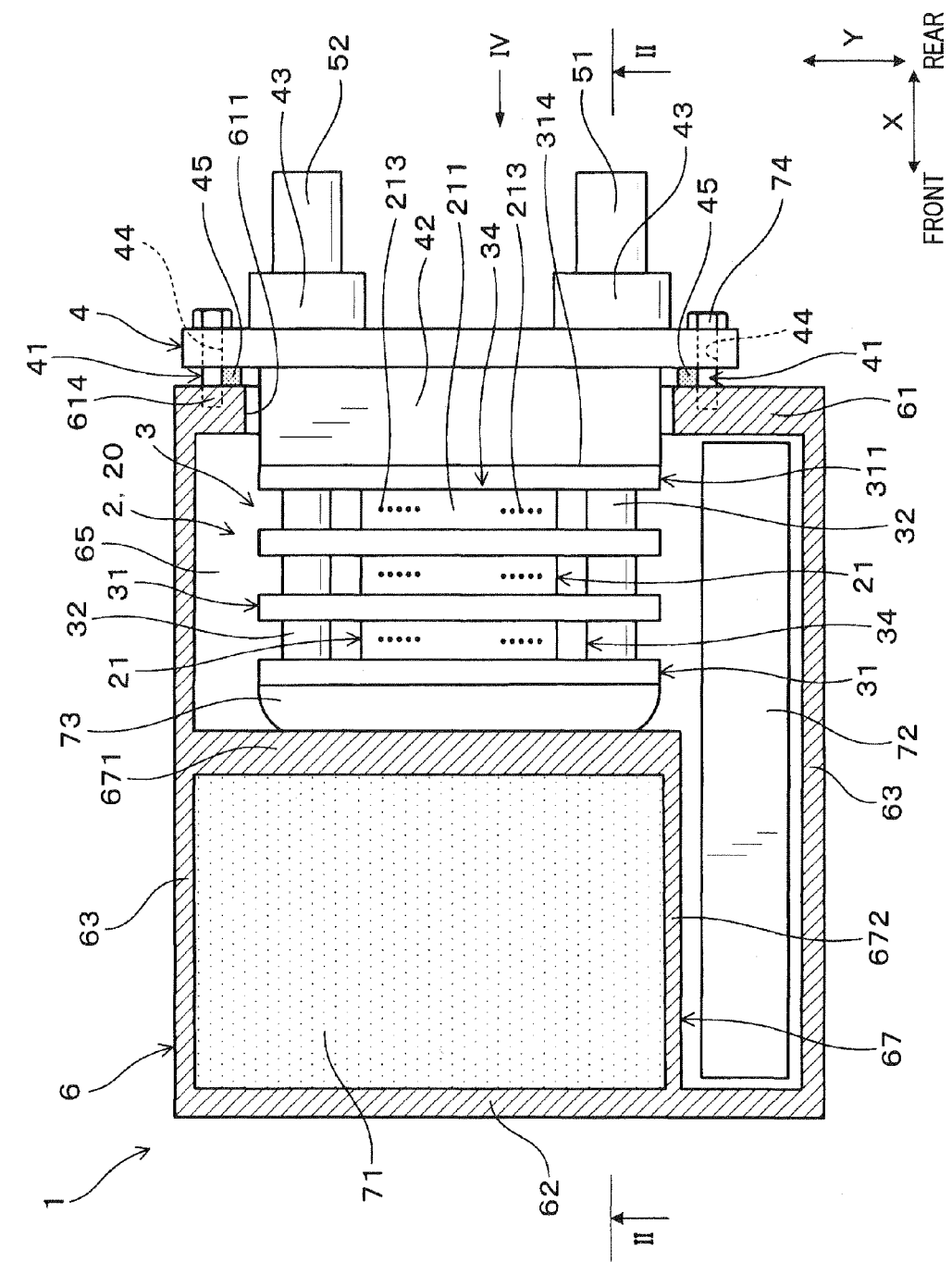
FIG. 1 shows a plan view of an electric power converter in a first embodiment.
Figure 2:
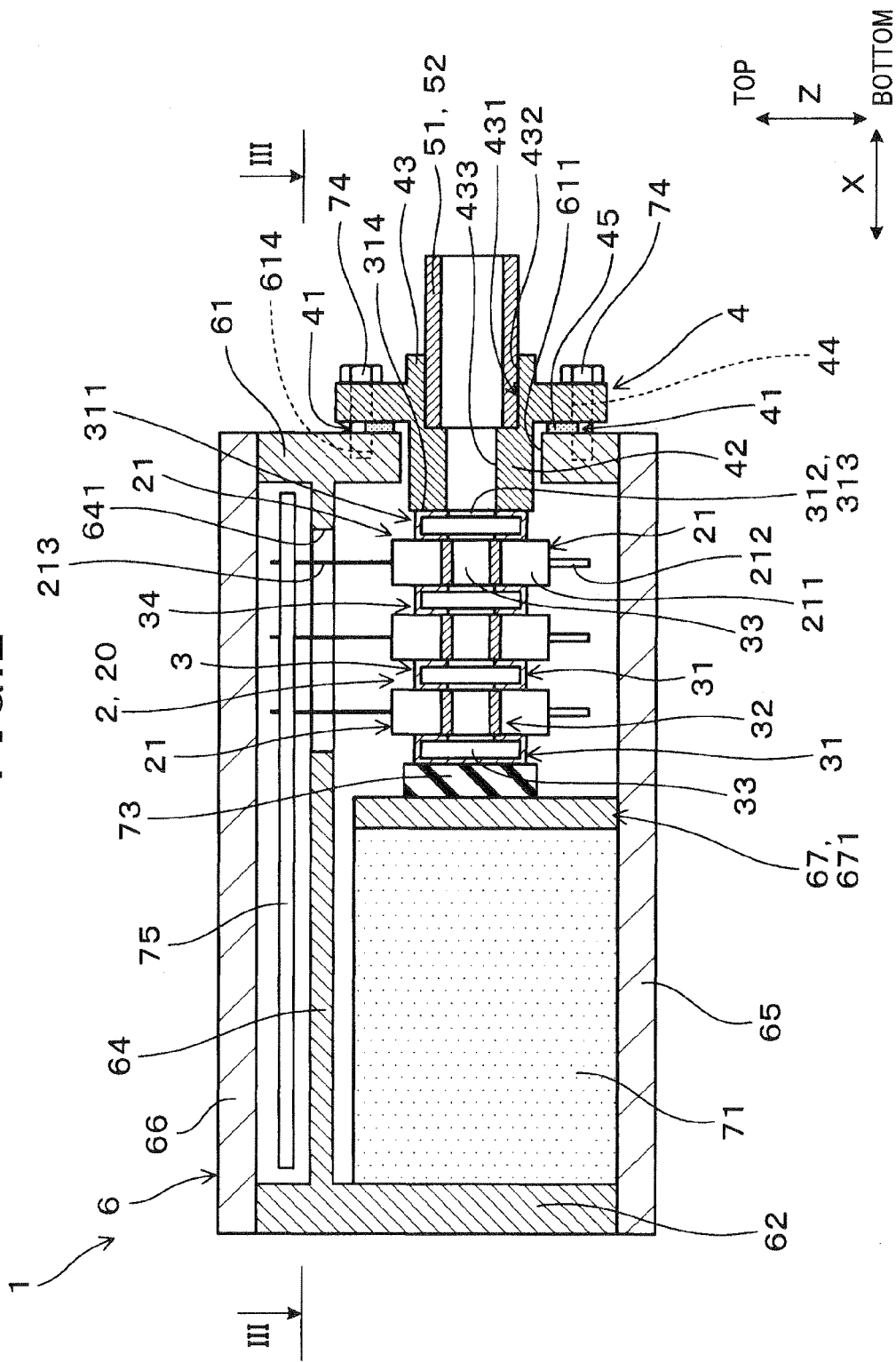
FIG. 2 shows a sectional view taken along a line II-II in FIG. 1.

As shown in FIGS. 1 and 2, an electric power converter 1 has a stacked semiconductor unit 20, and a case 6 that accommodates the stacked semiconductor unit 20 inside. The stacked semiconductor unit 20 is a semiconductor structure unit 2 formed by stacking semiconductor modules 21 that are parts of the power conversion circuit and a cooler 3 having a plurality of cooling tubes 31 for cooling the semiconductor modules 21. The case 6 has a rear wall portion 61, front wall portion 62, and a pair of side wall portions 63. The rear wall portion 61 and the front wall portion 62 are disposed on opposite sides of a longitudinal direction X with respect to the stacked semiconductor unit 20. In addition, the side wall portions 63 connect both ends of the rear wall portion 61 and the front wall portion 62 with each other in a lateral direction Y.

The rear wall portion 61 has an opening hole 611 formed in a shape that an outer profile of the cooler 3 fits inside when viewed from the longitudinal direction X.

The stacked semiconductor unit 20 has a closing member 4, a refrigerant introducing pipe 51, and a refrigerant discharging pipe 52.

The closing member 4 is joined to a rear-most cooling pipe 311 that is disposed on a rear side in the longitudinal direction X to close the opening hole 611. The refrigerant introducing pipe 51 is extended rearward from the closing member 4 and introduces a coolant into the cooler 3. The refrigerant discharging pipe 52 is extended rearward from the closing member 4 and discharges the refrigerant from the inside of the cooler 3.

The closing member 4 and the case 6 are in close contact due to an opposing seal section 41 formed between the closing member 4 and the rear wall portion 61.

Hereinafter, more details will be described.

The electric power converter 1 in the present embodiment is intended to be mounted on a vehicle such as a hybrid car. The electric power converter 1 can convert a DC power supplied from a battery into a three-phase AC power for driving a three-phase AC rotating electric machine.

As shown in FIGS. 1 and 2, the case 6 has a bottom portion 65, and four wall portions 61, 62, 63, 63, and a lid portion 66. The bottom portion 65 has a substantially rectangular shape when viewed from a height direction Z. The four wall portions 61, 62, 63, 63 are disposed standing perpendicularly from outer edges of the bottom portion 65. The lid portion 66 covers an opening formed on an upper end of the four wall portions 61, 62, 63, 63. Further, inside of the four wall portions 61, 62, 63, 63, there are provided an inner wall portion 64 disposed so as to intersect perpendicularly to the height direction Z and a partition wall portion 67 that forms a space for arranging electronic components.

The four wall portions 61, 62, 63, 63 include a front wall portion 62, a rear wall portion 61, and a pair of side wall portions 63. The front wall portion 62 is disposed standing perpendicularly from a front end of the bottom portion 65. The rear wall portion 61 is disposed standing perpendicularly from a rear end of the bottom portion 65. The pair of side wall portions 63 connect the ends in the lateral direction Y of the front wall portion 62 and the rear wall portion 61. The four wall portions 61, 62, 63, 63 have a square tubular shape, and openings disposed above and below thereof in the height direction Z are closed by the lid portion 66 and the bottom portion 65, respectively. In the present embodiment, the lid portion 66 and the bottom portion 65 are formed as a separate member from the four wall portions 61, 62, 63, 63. Further, sealing members, which are not shown, are disposed between the lid portion 66 and the four wall portions 61, 62, 63, 63, and between the bottom portion 65 and the four wall portions 61, 62, 63, 63.

Figure 4:
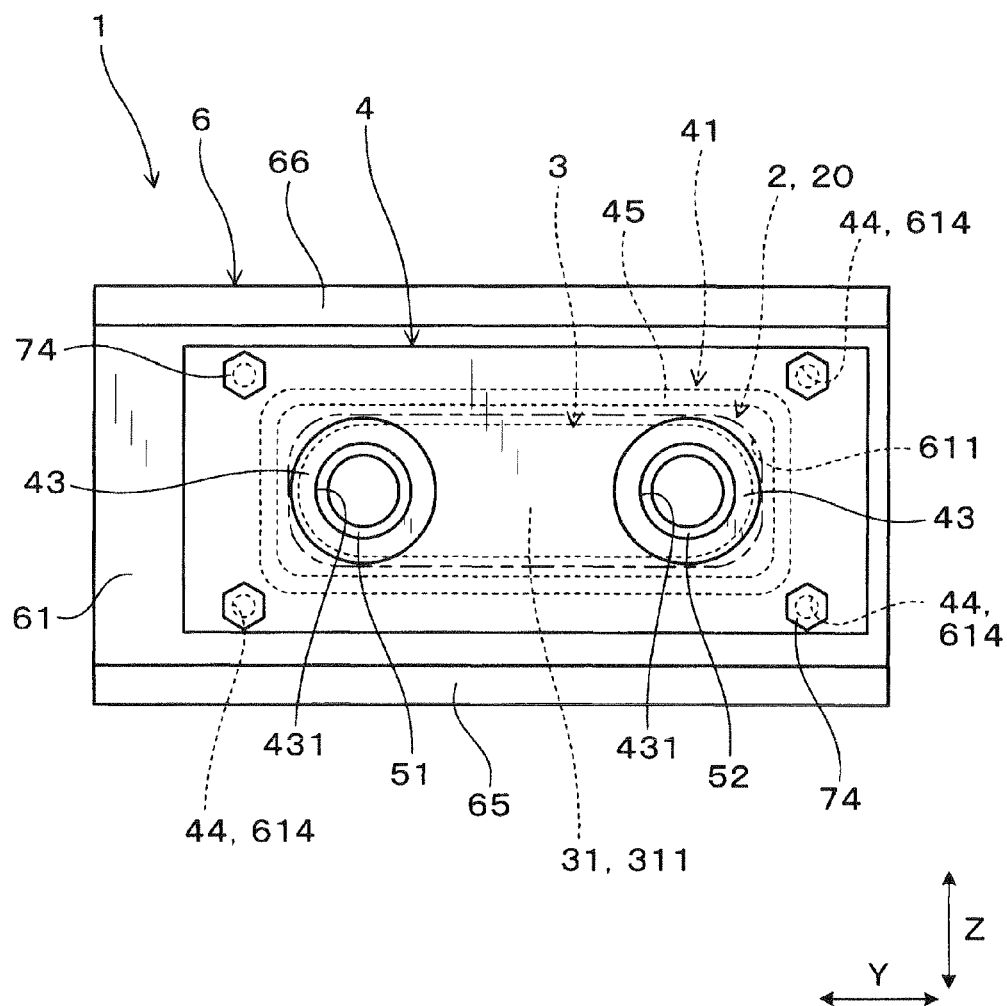
FIG. 4 shows an arrow IV view in FIG. 1.

As shown in FIGS. 1, 2 and 4, the rear wall portion has the opening hole 611 and four screw holes 614 around the opening hole 611 formed penetrating in the longitudinal direction X.

As shown in FIG. 4, the opening hole 611 is formed in the shape that the outer profile of the cooler 3 fits inside when viewed from the longitudinal direction X. In the present embodiment, the opening hole 611 is formed in a substantially elliptic shape extending in the lateral direction Y. Further, a maximum outer profile of the cooler 3 is an outer profile of the cooling tubes 31, and the cooler 3 can be inserted to the inside of the opening hole 611 from the rear.

The screw holes 614 are formed a total of four in the rear wall portion 61. A female screw to which a fixing screw 74 can be screwed is formed in an inner peripheral surface of each screw hole 614.

Figure 3:
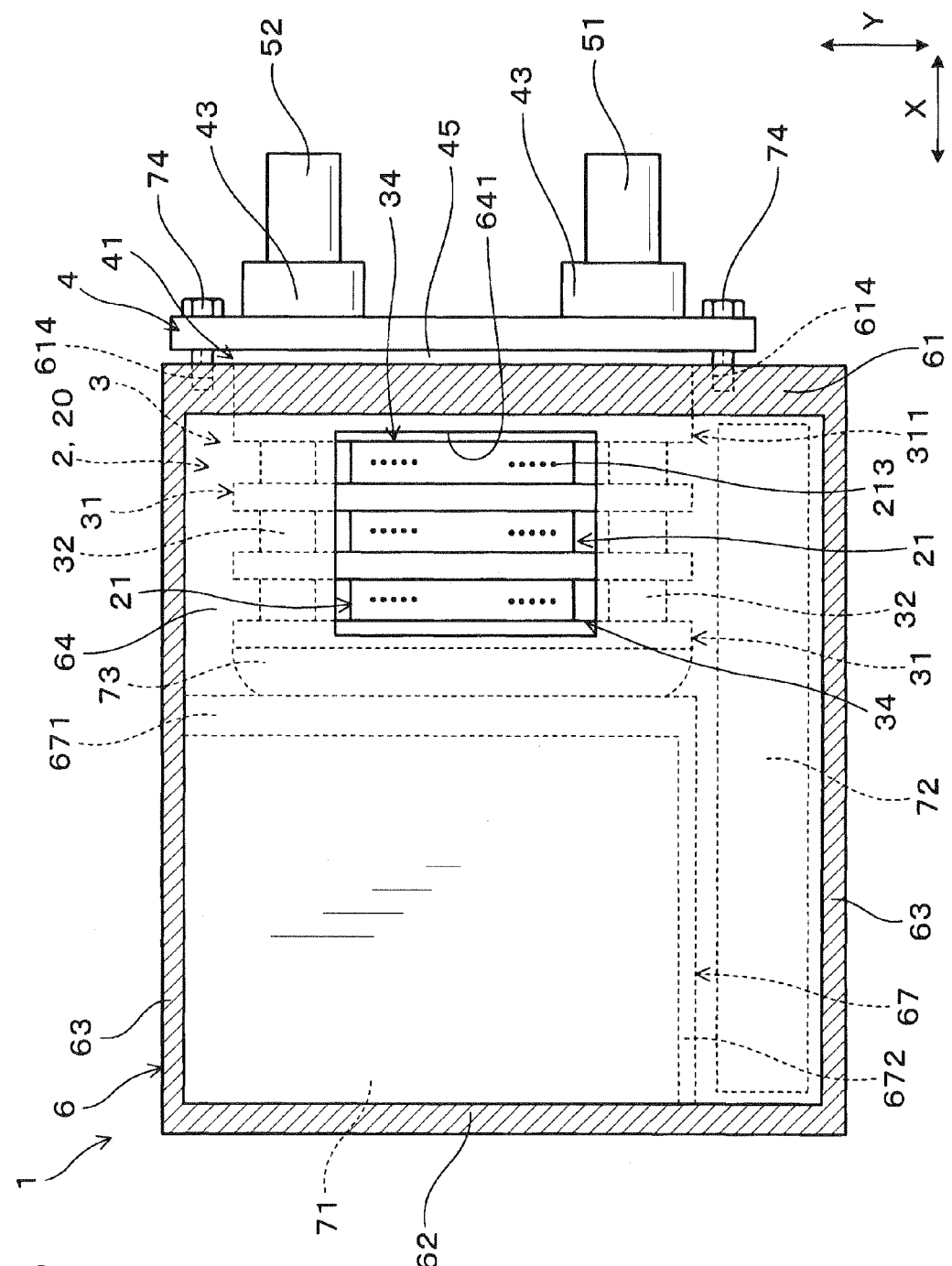
FIG. 3 shows a sectional view taken along a line in FIG. 2.

As shown in FIGS. 2 and 3, the inner wall 64 is formed in a position at an upper side in the height direction Z inside of the case 6 so as to intersect perpendicularly to the four wall portions 61, 62, 63, 63. In addition, an insertion opening 641 is formed penetrating a position in the inner wall portion 64 opposing module disposition spaces 34 formed between the cooling tubes 31 in the stacked semiconductor unit 20. The insertion opening 641 is formed with a width in the lateral direction Y shorter than a distance between the refrigerant introducing pipe 51 and the refrigerant discharging pipe 52, and is formed with a length in the longitudinal direction X shorter than a full length of the stacked semiconductor unit 20. Further, the insertion opening 641 is formed in a shape that an outer profile of the semiconductor modules 21 fits inside when viewed from the height direction Z.

As shown in FIGS. 1 and 2, the partition wall portion 67 is formed by a first partition wall 671 and a second partition wall 672. The first partition wall 671 is formed parallel with the rear wall portion 61. The second partition wall 672 is formed so as to extend toward the front side in the lateral direction Y from one end of the first partition wall 671. In the lateral direction Y, the one end of the first partition wall 671 is connected with one of the side wall portions 63, and the other end of the first partition wall 671 is disposed away from the other side wall portion 63. The first partition wall 671 has a role of receiving a pressure from a pressing member 73 that press-fixes the semiconductor stack unit 20. The second partition wall 672 is disposed parallel with the pair of side wall portions 63, and is disposed so as to connect the other end of the first partition wall 671 disposed away from the other side wall portion 63 and the front wall portion 62.

A reactor 71 as an electronic component constituting the power conversion circuit together with the semiconductor module 21 is disposed in a space surrounded by the partition wall portion 67, the front wall portion 62, and the side wall portion 63 connected to the partition wall portion 67.

Further, a terminal block 72 having connecting terminals electrically connected to a main electrode terminal 212 of the semiconductor module 21 is disposed between the partition wall portion 67 and the side wall portion 63 disposed away from the partition wall portion 67.

As shown in FIGS. 1 and 2, the stacked semiconductor unit 20 is disposed between the partition wall portion 67 and the rear wall portion 61. The stacked semiconductor unit 20 is formed by stacking a plurality of semiconductor modules 21 and the plurality of cooling tubes 31 alternately.

The semiconductor module 21 has a main body 211 integrated with a switching element such as an IGBT (Insulated Gate Bipolar Transistor) and a diode such as an FWD (freewheeling diode), main electrode terminals 212 projecting in one of the height directions Z, and control terminals 213 projecting in the other one of the height directions Z. The main electrode terminals 212 are electrically connected to bus bars (not shown). Further, the control terminals 213 are electrically connected to a control circuit board 75.

The plurality of cooling tubes 31 are formed elongating in the lateral direction Y. The cooling tubes 31 adjacent to each other constitute the cooler 3 by being connected by deformable connecting pipes 32 at both ends in the lateral direction Y. That is, the module disposition spaces 34 that correspond the length of the connecting pipes 32 are formed between the adjoining cooling tubes 31, and the semiconductor modules 21 are sandwiched and held by the cooling tubes 31 by deforming the connecting pipes 32 to be shorter after disposing the semiconductor modules 21 to the module disposition spaces 34.

As shown in FIG. 2, an introducing opening 312 and a discharging opening 313 that are communicated with a refrigerant passage 33 where the refrigerant circulates formed in the cooler 3 are respectively opened at both ends of a rear surface 314 of the rear-most cooling pipe 311 disposed at the rear end in the longitudinal direction X in the cooler 3. Further, the closing member 4 for fixing the stacked semiconductor unit 20 in the case 6 is attached to the rear surface 314 of the rear-most cooling pipe 311.

As shown in FIG. 4, the outer profile of the closing member 4 is formed into a rectangle shape to which the outer profile of the opening hole 611 fits inside when viewed from the longitudinal direction X. Further, the closing member 4 has a closing projection 42 projecting forward, a pair of projections 43 projecting rearward, and screw insertion holes 44 formed penetrating in positions corresponding to the screw holes 614 of the rear wall portion 61. The opposing seal section 41 is formed between the closing member 4 and the rear wall portion 61. The opposing seal section 41 is formed by an opposing surface to the rear wall portion 61 of the closing member 4, an opposing surface to the closing member 4 of the rear wall portion 61, and a sealing member 45 disposed between the closing member 4 and the rear wall portion 61. The sealing member 45 is formed annularly, and is disposed so as to surround a periphery of the opening hole 611. It is possible to adhere the closing member 4 and the case 6 by the sealing member 45 by fixing the closing member 4 to the rear wall portion 61 so as to close the opening hole 611. Thereby, foreign matter such as moisture can be prevented from entering into the case 6 from the opening hole 611. Incidentally, a paste-like sealing agent, gaskets or the like may be used in addition to the sealing member 45.

As shown in FIG. 4, the closing projection 42 is formed in an outer profile that fits inside the opening hole 611 when viewed from the longitudinal direction X, and a front end surface thereof is adhered and joined with the rear surface 314 of the rear-most cooling pipe 311. The closing projection 42 and the rear-most cooling pipe 311 may be joined by brazing or welding.

As shown in FIGS. 1, 2, and 4, the pair of projections have cylindrical shapes extending rearward, and are disposed so as to be coaxial with the introducing opening 312 and the discharging opening 313 of the rear-most cooling pipe 311 when viewed from the longitudinal direction X. A pair of penetrating holes 431 penetrating the pair of projecting portions 43 and the closing projection 42 in the longitudinal direction X is formed in the closing member 4. The pair of penetrating holes 431 has large diameter portions 432 disposed in the rear side thereof and small diameter portions 433 disposed in the front side thereof having smaller inner diameter than that of the large diameter portions 432, and respectively communicate the introducing opening 312 and the discharging opening 313.

As shown in FIG. 2, the refrigerant introducing pipe 51 for introducing the refrigerant into the cooler 3 and the refrigerant discharging pipe 52 for discharging the refrigerant from the cooler 3 are connected to the pair of penetrating holes 431 so as to protrude rearward. Each of the refrigerant introducing pipe 51 and the refrigerant discharging pipe 52 is formed in a cylindrical shape with a large diameter than the diameter of the connecting pipe 32, and is fitted inside the pair of penetrating holes 431, respectively. In addition, the refrigerant introducing pipe 51 and the refrigerant discharging pipe 52 are driven into the pair of penetrating holes 431 so that they are in close contact with inner peripheral surfaces of the penetrating holes 431. It should be noted that a sealing member or sealing agent and the like may be disposed between the refrigerant introducing pipe 51, the refrigerant discharging pipe 52, and the inner peripheral surfaces of the penetrating holes 431, or they may be joined by brazing, welding or the like. Moreover, the refrigerant introducing pipe 51, the refrigerant discharging pipe 52, and the closing member 4 may be formed integrally.

In the cooler 3, the refrigerant introduced from the refrigerant introducing pipe 51 flows into the rear-most cooling pipe 311 from the introducing opening 312, and then is distributed to each cooling tube 31 passing through the connecting pipes 32 appropriately. Then, while flowing through each cooling pipe 31, the refrigerant exchanges heat with the semiconductor modules 21. The refrigerant with its temperature increased by the heat exchange passes through the downstream side of the connecting pipes 32 appropriately, and is directed from the discharging opening 313 to the refrigerant discharging pipe 52, and then is discharged from the cooler 3.

As a refrigerant, for example, natural coolant such as water or ammonia, water mixed with ethylene glycol-based antifreeze, fluorocarbon-based coolant such as FLUORINERT (registered trademark), other fluorocarbon-based coolant such as HCFC123 or HFC134a, alcohol-based coolant such as methanol or alcohol, or ketone-based coolant such as acetone, may be used.

Figure 5:
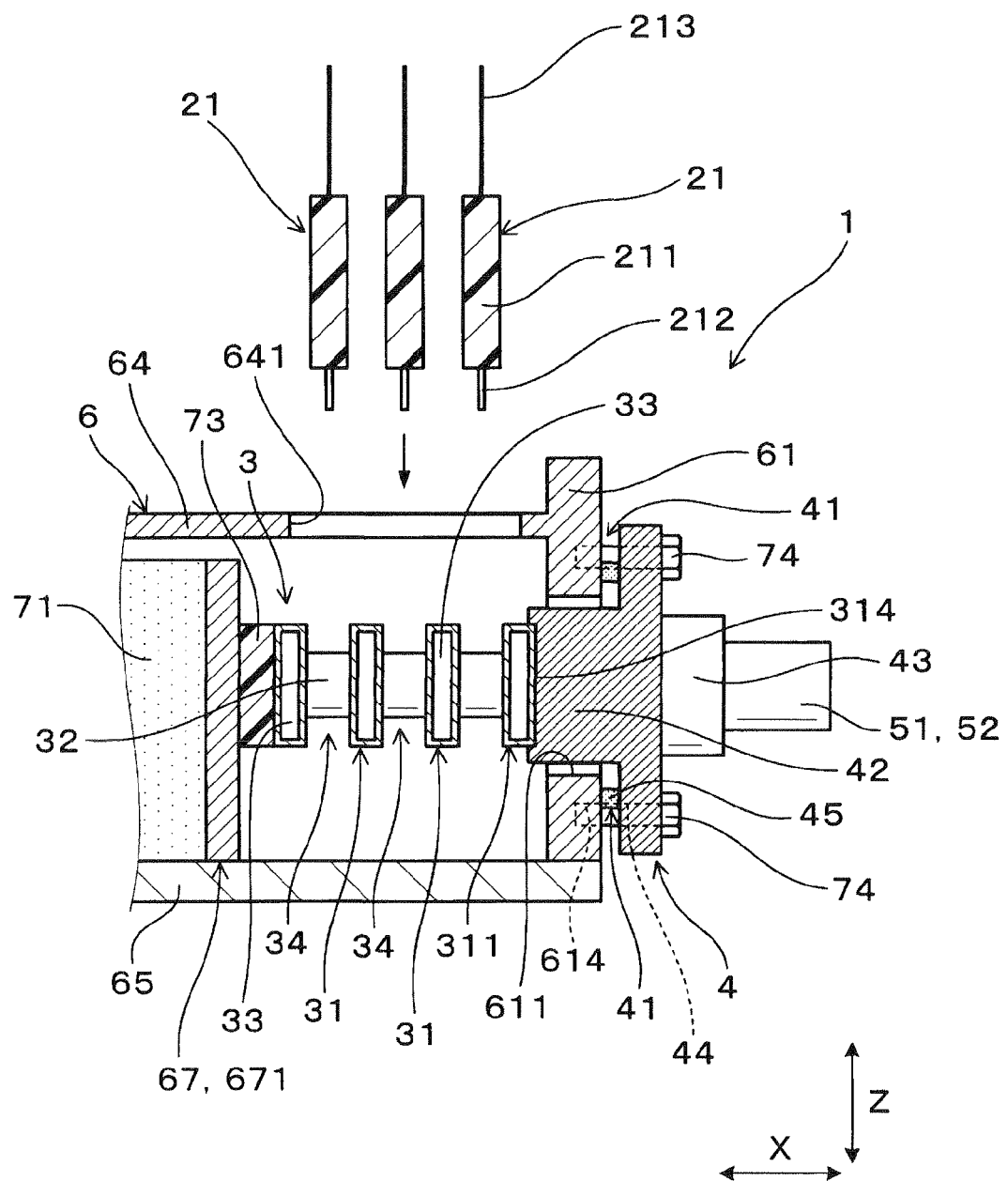
FIG. 5 shows an explanatory view of an assembling process of the electric power converter in the first embodiment.

The stacked semiconductor unit 20 is accommodated in the case 6, as follows. As shown in FIG. 5, the pressing member 73 is disposed behind the first partition wall 671 in the partition wall portion 67 inside the case 6 in a condition before attaching the lid portion 66 thereto. Then, the cooler 3 with the closing member 4 attached thereto is inserted from the front end of the opening hole 611 to the inside. At this moment, while inserting the fixing screws 74 into the screw insertion holes 44 of the closing member 4, the fixing screws 74 are screwed into the screw holes 614 to the extent that the connecting pipes 32 do not deform, and the stacked semiconductor unit 20 is temporarily fixed to the case 6.

Next, the semiconductor modules 21 are disposed into the module disposition spaces 34 formed between the adjoining cooling tubes 31 in the cooler 3. The semiconductor modules 21 are inserted into the module disposition spaces 34 from the insertion opening 641 of the inner wall portion 64. Then, the closing member 4 is fixed to the case 6 by screwing the fixing screws 74 into the screw holes 614 of the rear wall portion 61. When fixing the closing member 4 to the rear wall portion 61, the cooler 3 is urged forward by the closing member 4. Thus, the connecting pipes 32 are deformed to be shorter in the axial direction, and distances between the adjoining cooling tubes 31 decrease so that the semiconductor modules 21 are sandwiched and held by the cooling tubes 31. Incidentally, due to the pressing member 73 being pressed by the cooler 3, pressurizing force occurs in the pressing member 73, and a condition where the stacked semiconductor unit 20 is pressed in the longitudinal direction X is maintained. It should be noted that the pressing member 73 may be constituted by elastic members such as a coil spring, a leaf spring, a rubber, or the like, for example.

Next, functions and effects of the present embodiment are explained.

In the electric power converter 1, the refrigerant introducing pipe 51 and the refrigerant discharging pipe 52 are extended from the closing member 4, as well as connected in close contact with each other. Thus, by connecting the refrigerant introducing pipe 51 and the refrigerant discharging pipe 52 directly to the closing member 4, the sealability of the refrigerant introducing pipe 51, the refrigerant discharging pipe 52 and the closing member 4 is ensured while positioning between them can be performed easily. Thereby, dimensional accuracy between the refrigerant introducing pipe 51, the refrigerant discharging pipe 52 and the closing member 4 is improved, and a use of a component conventionally required for regulating positions of the refrigerant introduction pipe 51 and the refrigerant discharging pipe becomes unnecessary. Accordingly, the number of parts in the electric power converter 1 is reduced, and it is possible to simplify the structure of the electric power converter 1.

In addition, since the refrigerant introducing pipe 51 and the refrigerant discharging pipe 52 are made to extend from the closing member 4, a seal between outer surfaces of the refrigerant introducing pipe 51 and the refrigerant discharging pipe 52, and the case 6 becomes unnecessary. Although a seal between the case 6 and the closing member 4 is necessary, a seal section between them is formed by close contact between the two components. Therefore, it is possible to easily ensure the sealability of the case 6. By fixing the closing member 4 with respect to the case 6, the positioning of both components can be easily performed, and thus it is possible to prevent the sealability from decreasing due to misalignment.

Further, the refrigerant introducing pipe 51 and the refrigerant discharging pipe 52 are connected to the cooler 3 through the closing member 4. Therefore, the length of the refrigerant introducing pipe 51 and the refrigerant discharging pipe 52 can be shortened compared with a case where the refrigerant introducing pipe 51 and the refrigerant discharging pipe 52 are connected to the cooler directly. Accordingly, it is possible to alleviate the stress generated in roots of the refrigerant introducing pipe 51 and the refrigerant discharging pipe 52 when a load is applied to tip sides of the refrigerant introducing pipe 51 and the refrigerant discharging pipe 52.

Further, the refrigerant introducing pipe 51 and the refrigerant discharging pipe 52 are extended rearward from the closing member 4, and are needed not to be directly joined to the rear-most cooling pipe 311. Therefore, it is possible to design diameters of the refrigerant introducing pipe 51 and the refrigerant discharging pipe 52 regardless of the size of the cooler 3. Therefore, even when a small cooler 3 is adopted, it is not necessary to reduce accordingly the diameters of joint portions of the refrigerant introducing pipe 51 and the refrigerant discharging pipe 52 to the rear-most cooling pipe 311. Thus, the electric power converter 1 can be miniaturized without making the shapes of the refrigerant introducing pipe 51 and the refrigerant discharging pipe 52 complicated.

The cooler 3 has the plurality of cooling tubes 31, and the semiconductor structure unit 2 is made of the semiconductor stacked unit 20 stacking the semiconductor modules 21 and the plurality of cooling tubes 31 in the longitudinal direction X. Therefore, the stacked semiconductor unit 20 can be compressed in the longitudinal direction X, i.e., in the stacking direction of the stacked semiconductor unit 20 by the force generated when fixing the closing member 4 to the case 6. Thus, the stacked semiconductor unit 20 can be easily compressed, and the cooling tubes 31 and the semiconductor module 21 can be easily adhered.

Further, the seal section is the opposing seal section 41 formed to oppose the rear surface of the rear wall portion 61 in the closing member 4 in the longitudinal direction, and the closing member 4 and the rear wall portion 61 are brought into close contact by the opposing seal section 41. When fixing the closing member 4 to the rear wall portion 61, a force pressing the closing member 4 toward the rear wall portion 61 is applied. Therefore, the opposing seal section 41 can be easily adhered to the closing member 4 and the rear wall portion 61. Thereby, the sealability between the case 6 and the closing member 4 can be improved.

Further, the closing member 4 has the pair of penetrating holes 431, and the refrigerant introducing pipe 51 and the refrigerant discharging pipe 52 are fitted and fixed to the pair of penetrating holes 431. Therefore, by forming the refrigerant introducing pipe 51 and the refrigerant discharging pipe 52, and the closing member 4 by different members, each member can be easily manufactured. Further, the refrigerant introducing pipe 51 and the refrigerant discharging pipe 52 can be easily connected to the closing member 4. Thereby, productivity of the electric power converter 1 improves.

Moreover, the case 6 has the inner wall portion 64 formed so as to intersect perpendicular to the rear wall portion 61. The inner wall portion 64 has the insertion opening 641 in the position opposing the module disposition spaces 34 formed between the cooling tubes 31 in the stacked semiconductor unit 20 for inserting the semiconductor modules 21 to the module disposition spaces 34. Therefore, by disposing the inner wall portion 64, the rigidity of the case 6 improves. Thus, the case 6 is prevented from being deformed by the pressure of the pressing member 73 when the stacked semiconductor unit 20 is press-fixed by the pressure of the pressing member 73, or the like. In addition, electromagnetic shielding properties in the height direction Z of the electric power converter 1 can be improved by the inner wall portion 64. Furthermore, since the insertion opening 641 is formed in the inner wall portion 64, the semiconductor modules 21 can be easily inserted and disposed in the module disposition spaces 34 through the insertion opening 641.

Figure 6:
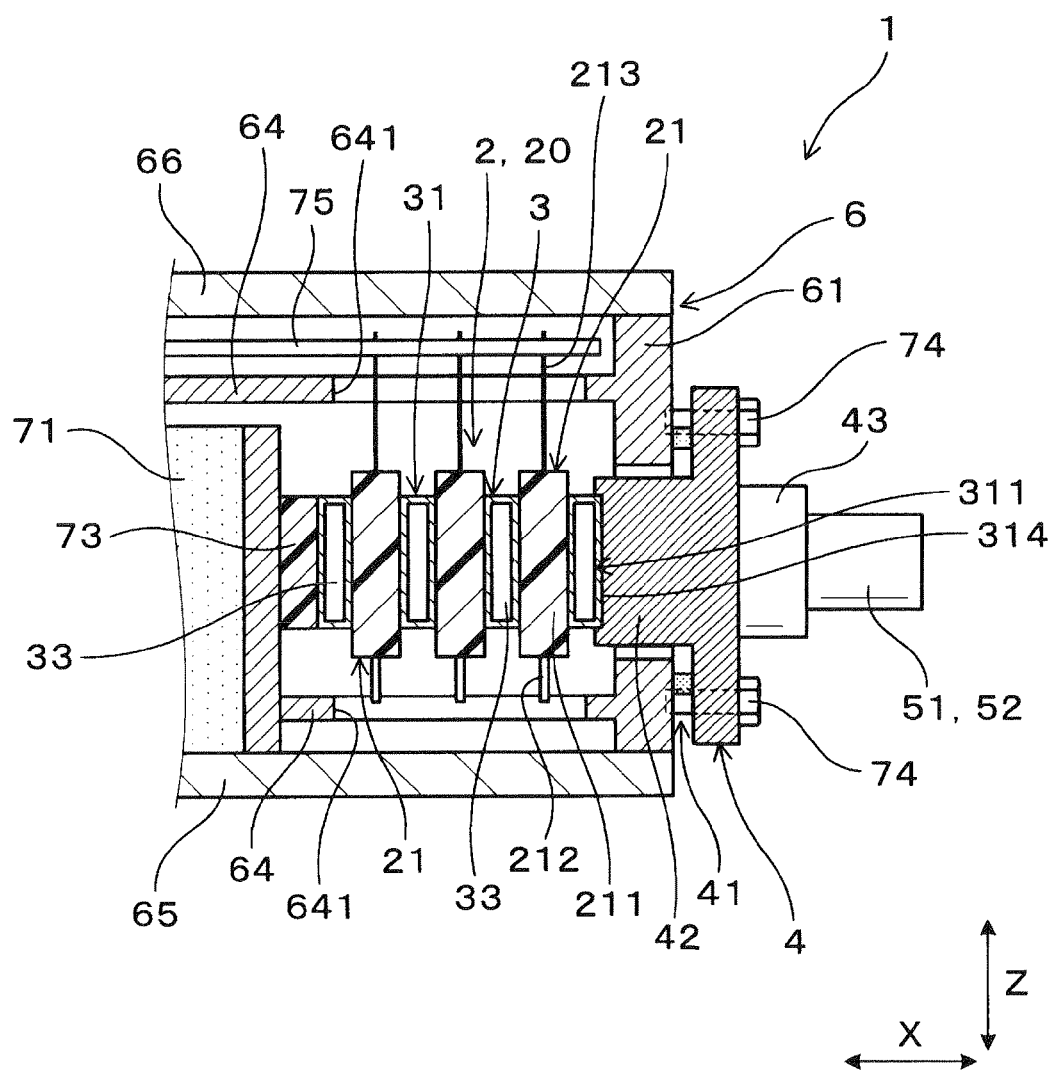
FIG. 6 shows a cross-sectional view of an example of the electric power converter in the first embodiment.

In the present embodiment, a single inner wall portion 64 is disposed on the upper side of the case 6. However, as shown in FIG. 6, another inner wall portion 64 may be dispose on the lower side of the case 6. In this case, the rigidity and the electromagnetic shielding properties of the case 6 may be further improved.

The insertion opening 641 is formed with the width in the lateral direction Y shorter than the distance between the refrigerant introducing pipe 51 and the refrigerant discharging pipe 52. In addition, the insertion opening 641 is formed with the length in the longitudinal direction X shorter than the full length of the stacked semiconductor unit 20, and is formed in the shape that the outer profile of the semiconductor modules 21 fits inside when viewed from the height direction Z. Therefore, the size required for the insertion opening 641 in order to assemble the semiconductor modules 21 to the module disposition spaces 34 from the insertion opening 641 can be secured. Moreover, a decrease in the shielding effect of the electromagnetic by the inner wall portion 64 due to the disposition of the insertion opening 641 can be suppressed.

As described above, according to the electric power converter 1 of the present embodiment, miniaturization and a reduction of the components become possible, and the sealability can be easily improved.

Second Embodiment

Figure 7:
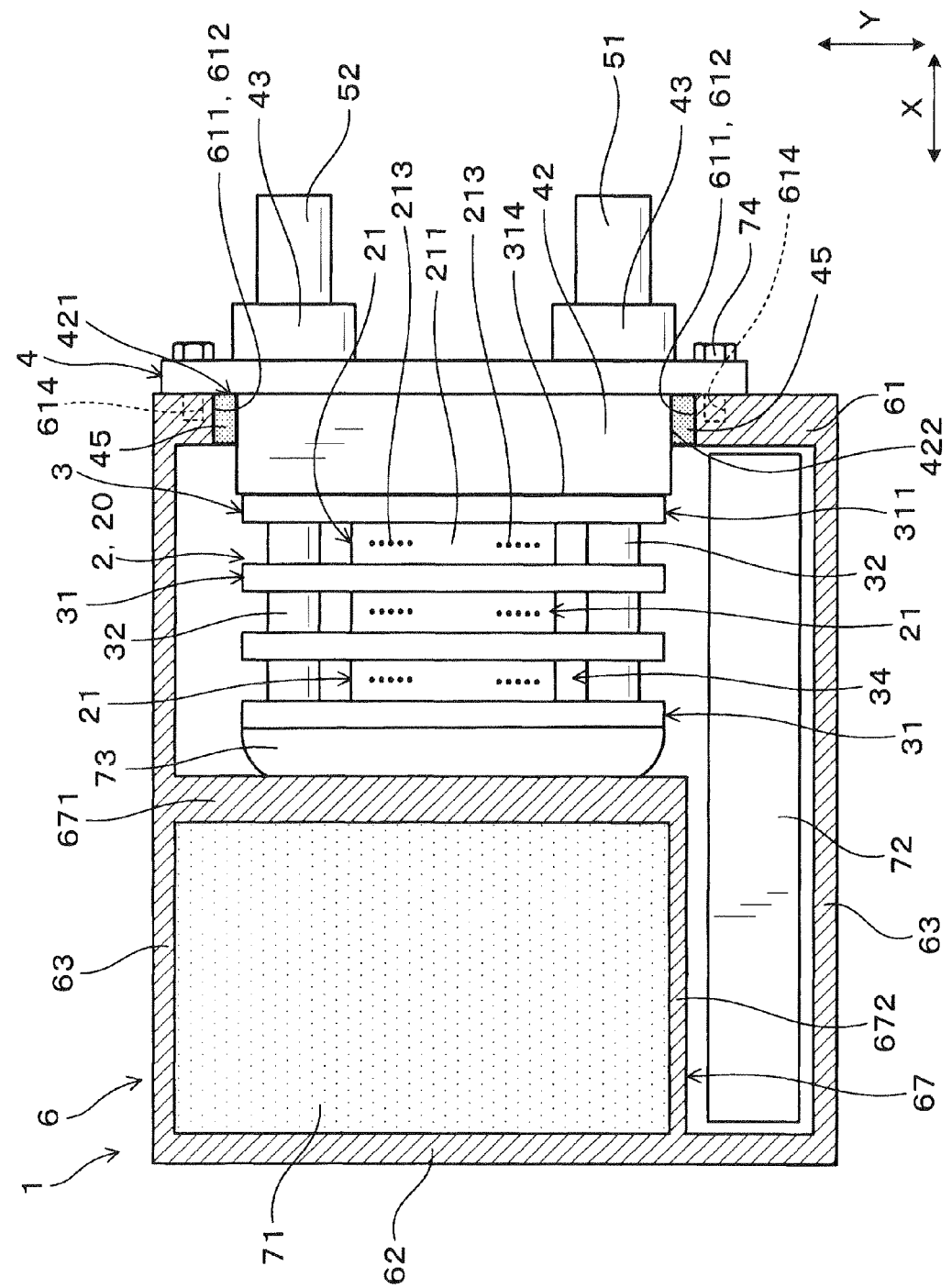
FIG. 7 shows a plan view of the electric power converter in a second embodiment.

The second embodiment shows an example that a part of the configuration of the electric power converter 1 of the first embodiment is changed, as shown in FIG. 7.

In the electric power converter 1 of the present embodiment, a seal section between the case 6 and the closing member 4 is an outer peripheral seal section 421 formed by an outer peripheral surface 422 of the closing projection 42 disposed in the direction perpendicular to the longitudinal direction X, an inner peripheral surface 612 of an opening hole 611 that opposes an outer peripheral surface 422, and a sealing member 45 disposed between the outer peripheral surface 422 and the inner peripheral surface 612. A closing projection 42 is inserted and disposed inside the annular sealing member 45. The sealing member 45 is in close contact and sealed to the outer circumferential surface 442 of the closing projection 42 and the inner peripheral surface 612 of an opening hole 611 by inserting the closing projection 42 disposed with the sealing member 45 to the inside of the opening hole 611. It should be appreciated that, in the second embodiment, components identical with or similar to those in the first embodiment are given the same reference numerals, and structures and features thereof will not be described in order to avoid redundant explanation.

In the electric power converter 1 of the present embodiment, between the rear wall portion 61 and the closing member 4 is in close contact by the outer peripheral seal section 421 by inserting and disposing the closing projection 42 inside the opening hole 611. Thus, even if loosening occurs in fixation of the closing member 4 and the case 6, as long as the seal section 421 does not detach from the opening hole 611, the sealability between the closing member 4 and the case 6 can be ensured. In addition, it is possible to obtain the same effects as in the first embodiment in the present embodiment.

Third Embodiment

Figure 8:
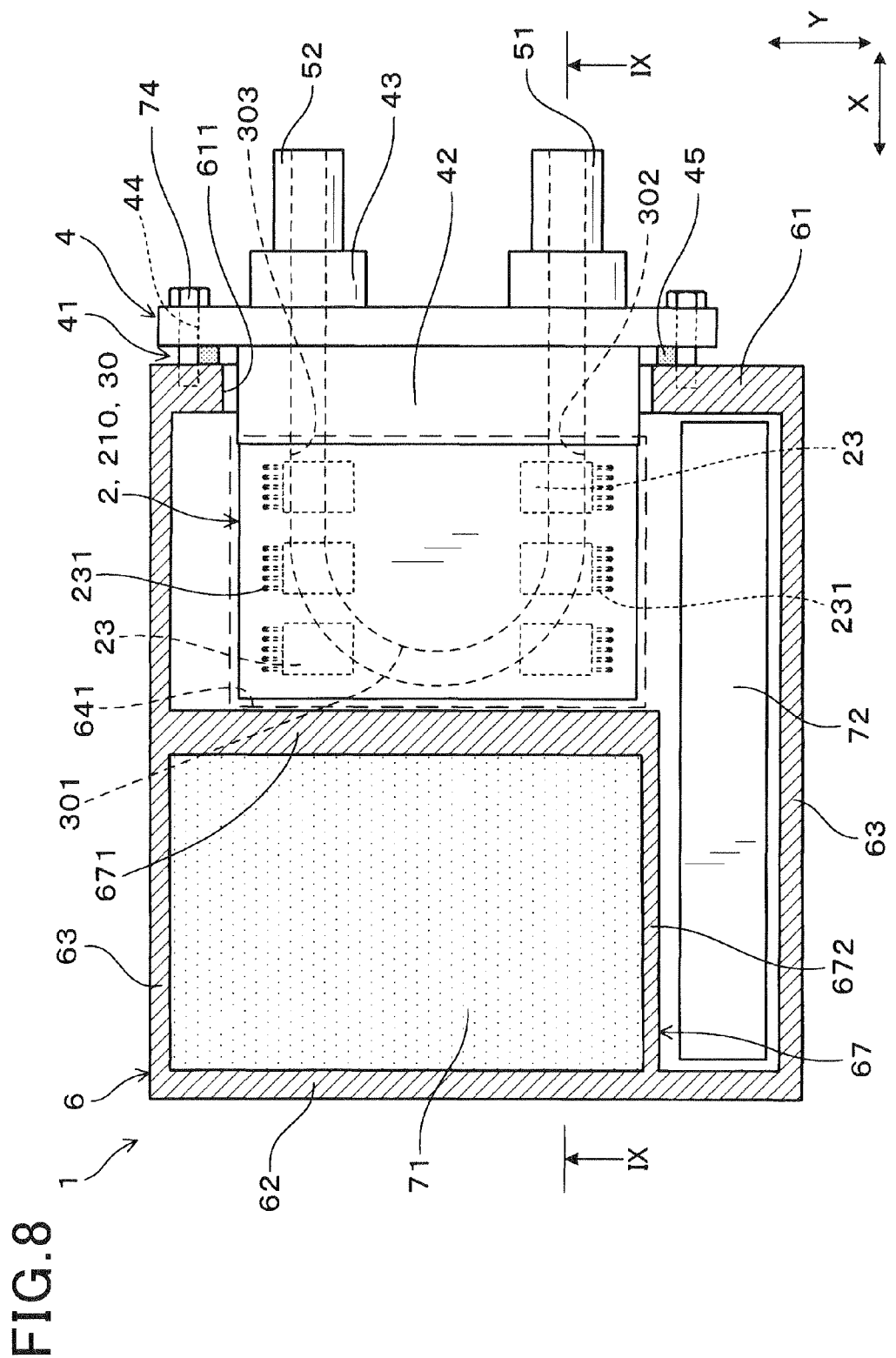
FIG. 8 shows a plan view of the electric power converter in a third embodiment.
Figure 9:
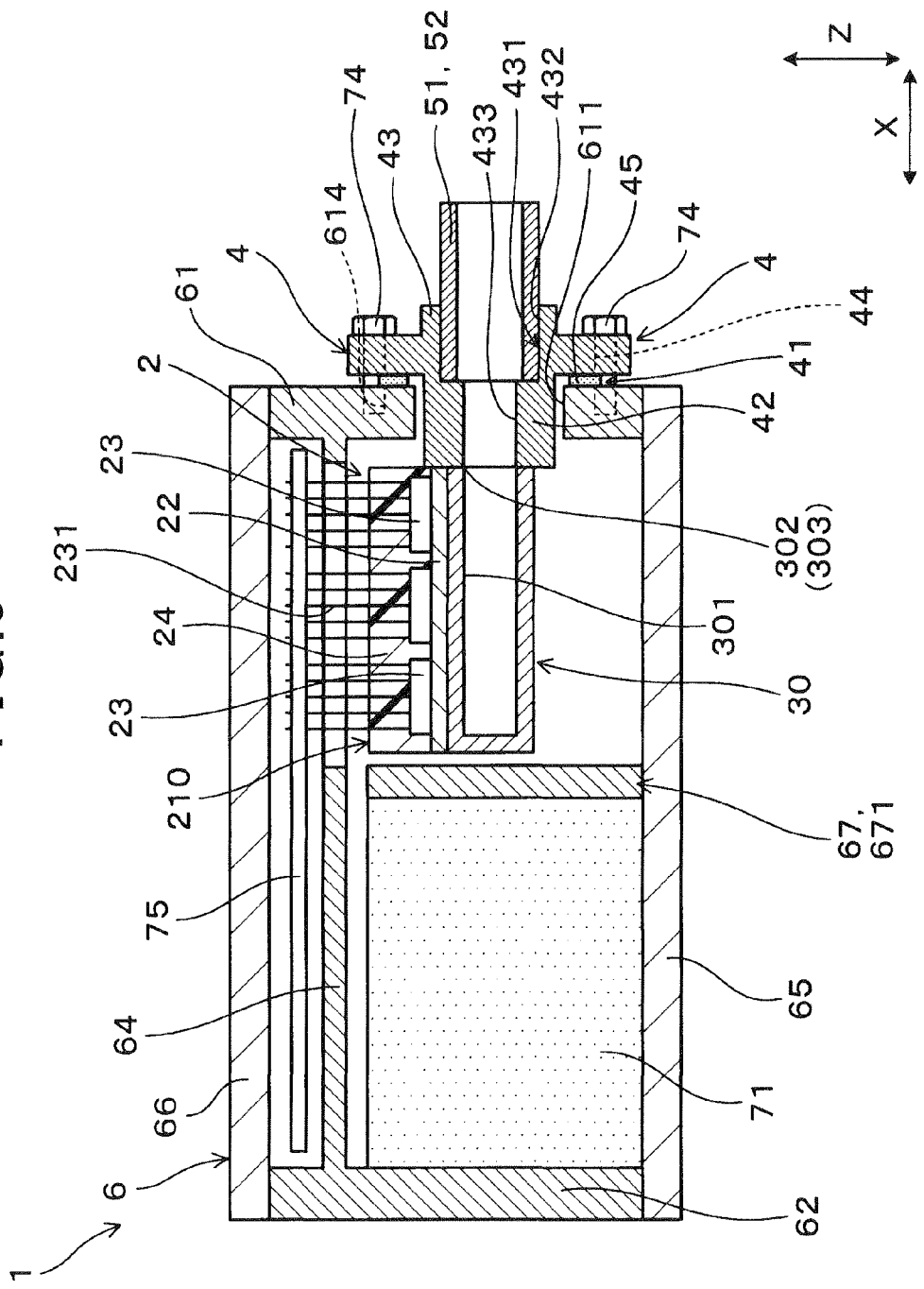
FIG. 9 shows a cross-sectional view taken along a line IX-IX in FIG. 8.

The third embodiment shows an example that a part of the configuration of the electric power converter 1 of the first embodiment is changed, as shown in FIGS. 8 and 9. A semiconductor structure unit 2 of the present embodiment has a semiconductor module 210 composed of an IPM (Intelligent Power Module), and a cooler 30 for cooling the semiconductor module 210.

The semiconductor module 210 has a heat sink 22 disposed on the cooler 30, six semiconductor elements 23 disposed on the heat sink 22, and a protection circuit (not shown). The semiconductor element 23 and the protection circuit are fixed integrally by resin-molding on the heat sink 22. Each semiconductor element 23 has control terminals 231 that are connected to a control circuit board 75. The control terminals 231 are disposed standing perpendicularly from a resin layer 24.

The cooler 30 has a substantially rectangular shape, and a closing member 4 is joined to a rear surface of the cooler 30. A substantially U-shaped refrigerant passage 301 when viewed from above is disposed inside the cooler 30, and a refrigerant introducing port 302 and a refrigerant discharging port 303 are opened in the rear surface of the cooler 30. The refrigerant introducing port 302 and the refrigerant discharging 303 are communicated with a refrigerant introducing pipe 51 and a refrigerant discharging pipe 52, respectively.

An insertion opening 641 formed in the inner wall portion 64 of the case 6 is formed into a size to which an outer profile of the semiconductor module 210 fits when viewed from above. In addition, assembling of the semiconductor structure unit 2 to the case 6 is performed by the following procedure.

First, the cooler 30 to which the closing member 4 is joined is inserted into the opening hole 611 of the rear wall portion 61, and, the closing member 4 is fixed to the rear wall portion 61. Then, the semiconductor module 210 is inserted into the inside of the case 6 through the insertion opening 641 of the inner wall portion 64, and is fixed to the cooler 30.

Other configurations are the same as those of the first embodiment.

In the electric power converter 1 of the present embodiment, the semiconductor module 210 made of the IPM fixed integrally by molding is used. Therefore, the structure of the electric power converter 1 becomes simple, and it is possible to easily perform the assembling work.

In addition, it is possible to obtain the same effects as in the first embodiment in the present embodiment.

Fourth Embodiment

Figure 10:
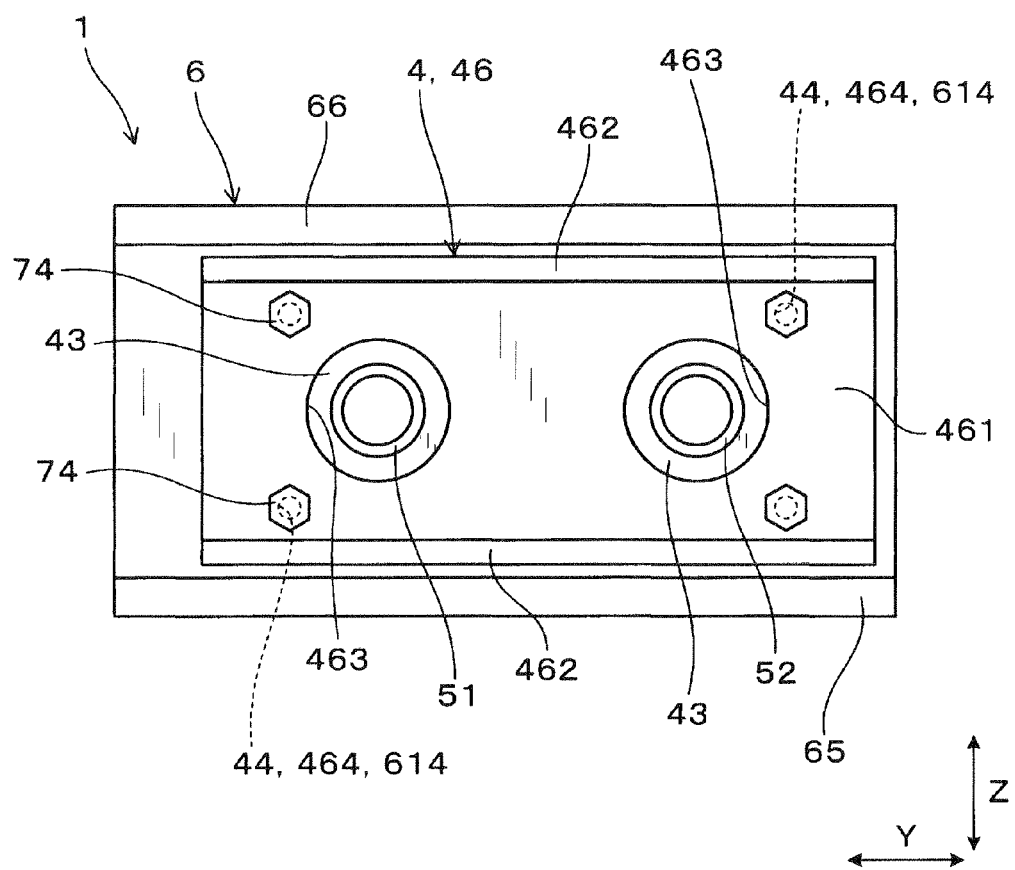
FIG. 10 shows an explanatory view of the electric power converter in a fourth embodiment.
Figure 11:
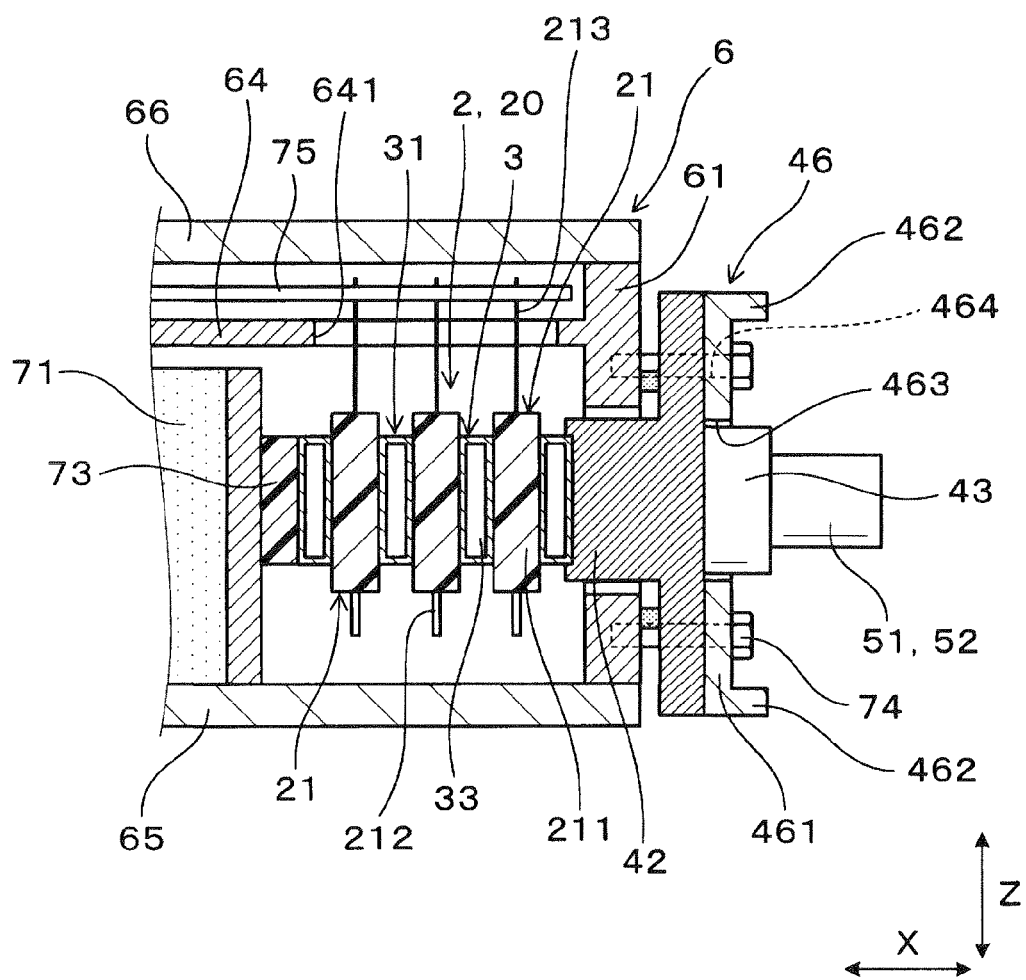
FIG. 11 shows a cross-sectional view taken along a line XI-XI in FIG. 10.

The fourth embodiment shows an example where a reinforcing member is attached to the closing member of the electric power converter in the first embodiment, as shown in FIGS. 10 and 11.

The reinforcing member 46 that the electric power converter 1 is provided with has a reinforcing main body 461 that abuts a rear surface of the closing member 4, and reinforcing ribs 462 that extend rearward from upper and lower ends of the reinforcing main body 461. An outer profile of the reinforcing member 46 is formed in substantially the same size of the closing member 4 when viewed from the rear. A pair of penetrating holes 463 for inserting a pair of projections 43 of the closing member 4 and reinforcing screw insertion holes 464 formed in positions corresponding to screw insertion holes 44 of the closing member 4 are formed in the reinforcing main body 461. The fixing screws 74 are inserted through the reinforcing screw insertion hole 464, and the reinforcing member 46 is fixed to the rear wall portion 61 together with the closing member 4.

Other configurations are the same as those of the first embodiment.

In the electric power converter 1 of the present embodiment, the reinforcing member 46 is attached to the closing member 4. Therefore, the strength and rigidity of the closing member 4 can be easily enhanced. In particular, it is effective to provide the reinforcing member 46 when the semiconductor structure unit 2 is a stacked semiconductor unit 20 having a stacked structure. That is, the stacked semiconductor unit 20 receives the pressure from the pressing member 73, and is fixed to the case 6 in a compressed state. At this time, since the pressure of the pressing member 73 is transmitted to the closing member 4 through the stacked semiconductor unit 20, the strength and rigidity are required for the closing member 4. Therefore, it is possible to easily impart strength and rigidity to the closing member 4 to withstand the pressure by providing the reinforcing member 46 to the closing member 4.

In addition, it is possible to obtain the same effects as in the first embodiment in the present embodiment.

It should be noted that the shape of the reinforcing member 46 shown in the present embodiment is one example, and various shapes other than this may be adopted.

What is claimed is:

1. An electric power converter comprising:
    a semiconductor structure unit that has semiconductor modules that are parts of a power conversion circuit and a cooler for cooling the semiconductor modules; and
    a case that accommodates the semiconductor structure unit inside;
    wherein, the case includes a rear wall portion having an opening hole, a front wall portion disposed opposing an inner front side of the rear wall portion, and a pair of side wall portions that connect both ends of the rear wall portion and the front wall portion with each other spaced apart in a lateral direction;
    the opening hole is formed in a shape that an outer profile of the cooler fits inside when viewed from a longitudinal direction in which the rear wall portion and the front wall portion are aligned along, the longitudinal direction being perpendicular to the lateral direction;
    the semiconductor structure unit has a closing member joined to a rear-most cooling pipe, the closing member that is disposed on an outer rear side of the rear wall portion in the longitudinal direction to close the opening hole, a refrigerant introducing pipe extended from the outer rear side of the rear wall portion rearward from the closing member and introduces a coolant into the cooler, and a refrigerant discharging pipe extended from the outer rear side of the rear wall portion rearward from the closing member and discharges the refrigerant from the inside of the cooler;
    the closing member and the case are in close contact by a seal section formed between the closing member and the rear wall portion,
    the seal section is an opposing seal section formed to oppose the outer rear side of the rear wall portion in the closing member in the longitudinal direction; and
    the closing member and the rear wall portion are brought into close contact by the opposing seal section.

2. The electric power converter according to claim 1, wherein,
    the cooler has a plurality of cooling tubes; and
    the semiconductor structure unit is a stacked semiconductor unit formed by stacking the semiconductor modules and the plurality of cooling tubes.

3. The electric power converter according to claim 1, wherein, the closing member has a pair of penetrating holes; and the refrigerant introducing pipe and the refrigerant discharging pipe are fitted and fixed to the pair of penetrating holes.

4. The electric power converter according to claim 1, wherein,
    the case has an inner wall portion formed so as to be perpendicular with each of the rear wall portion, the front wall portion, and the pair of side wall portions; and the inner wall portion has an insertion opening in a position corresponding to a module disposition space of the semiconductor structure unit for inserting the semiconductor modules into the module disposition space.

5. The electric power converter according to claim 4, wherein, the insertion opening is formed with a width in the lateral direction shorter than a distance between the refrigerant introducing pipe and the refrigerant discharging pipe;
    the insertion opening is formed with a length in the longitudinal direction shorter than a full length of the stacked semiconductor unit; and
    the insertion opening is formed in a shape that an outer profile of the semiconductor modules fits inside when viewed from a height direction, the height direction being perpendicular to each of the lateral direction and the longitudinal direction.

6. The electric power converter according to claim 1, wherein,
    a reinforcing member for enhancing the strength of the closing member is attached to the closing member.

7. An electric power converter comprising:
    a semiconductor structure unit that has semiconductor modules that are parts of a power conversion circuit and a cooler for cooling the semiconductor modules; and
    a case that accommodates the semiconductor structure unit inside;
    wherein, the case includes a rear wall portion having an opening hole, a front wall portion disposed opposing an inner front side of the rear wall portion, and a pair of side wall portions that connect both ends of the rear wall portion and the front wall portion with each other spaced apart in a lateral direction;
    the opening hole is formed in a shape that an outer profile of the cooler fits inside when viewed from a longitudinal direction in which the rear wall portion and the front wall portion are aligned along, the longitudinal direction being perpendicular to the lateral direction;
    the semiconductor structure unit has a closing member joined to a rear-most cooling pipe, the closing member is disposed on an outer rear side of the rear wall portion in the longitudinal direction to close the opening hole, a refrigerant introducing pipe extended from the outer rear side of the rear wall portion rearward from the closing member and introduces a coolant into the cooler, and a refrigerant discharging pipe extended from the outer rear side of the rear wall portion rearward from the closing member and discharges the refrigerant from the inside of the cooler;
    the closing member and the case are in close contact by a seal section formed between the closing member and the rear wall portion;
    the closing member has a closing projection projecting into an inner side of the opening hole;
    the seal section is an outer peripheral seal section formed by the closing projection and an inner surface of the opening hole in a direction perpendicular to the longitudinal direction of the closing projection; and
    the rear wall portion and the closing member are brought into close contact by the outer peripheral seal section.

8. The electric power converter according to claim 7, wherein, the cooler has a plurality of cooling tubes; and the semiconductor structure unit is a stacked semiconductor unit formed by stacking the semiconductor modules and the plurality of the cooling tubes.

9. The electric power converter according to claim 7, wherein, the closing member has a pair of penetrating holes; and the refrigerant introducing pipe and the refrigerant discharging pipe are fitted and fixed to the pair of penetrating holes.

10. The electric power converter according to claim 7, wherein,
the case has an inner wall portion formed so as to be perpendicular with each of the rear wall portion, the front wall portion, and the pair of side wall portions; and the inner wall portion has an insertion opening in a position corresponding to a module disposition space of the semiconductor structure unit for inserting the semiconductor modules into the module disposition space.

11. The electric power converter according to claim 10, wherein,
the insertion opening is formed with a width in the lateral direction shorter than a distance between the refrigerant introducing pipe and the refrigerant discharging pipe; the insertion opening is formed with a length in the longitudinal direction shorter than a full length of the stacked semiconductor unit; and the insertion opening is formed in a shape that an outer profile of the semiconductor modules fits inside when viewed from a height direction, the height direction being perpendicular to each of the lateral direction and the longitudinal direction.

12. The electric power converter according to claim 7, wherein, a reinforcing member for enhancing the strength of the closing member is attached to the closing member.

* * * * *